(12) United States Patent
Jung

(10) Patent No.: US 8,874,996 B2
(45) Date of Patent: Oct. 28, 2014

(54) MEMORY DEVICE HAVING RECONFIGURABLE REFRESH TIMING

(75) Inventor: Bu-Il Jung, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 167 days.

(21) Appl. No.: 13/597,416

(22) Filed: Aug. 29, 2012

(65) Prior Publication Data

US 2013/0111296 A1   May 2, 2013

(30) Foreign Application Priority Data

Oct. 27, 2011   (KR) .................. 10-2011-0110684

(51) Int. Cl.
*G11C 29/00* (2006.01)
*G06F 11/10* (2006.01)
*H03M 13/29* (2006.01)
*G11C 11/00* (2006.01)

(52) U.S. Cl.
CPC ........... *G06F 11/1048* (2013.01); *H03M 13/29* (2013.01); *G11C 11/00* (2013.01)
USPC ........................................................ 714/771

(58) Field of Classification Search
CPC ..... G11C 11/00; G06F 11/1048; H03M 13/29
See application file for complete search history.

(56) References Cited

U.S. PATENT DOCUMENTS

| | | | | |
|---|---|---|---|---|
| 5,758,148 | A * | 5/1998 | Lipovski ................................ | 1/1 |
| 5,777,608 | A * | 7/1998 | Lipovski et al. ............... | 345/519 |
| 6,614,704 | B2 * | 9/2003 | Dobler et al. ................. | 365/222 |
| 7,050,318 | B1 * | 5/2006 | Argyres ...................... | 365/49.15 |
| 7,477,563 | B2 | 1/2009 | Kang et al. | |
| 8,468,319 | B1 * | 6/2013 | Satran ........................... | 711/168 |
| 2001/0052062 | A1 * | 12/2001 | Lipovski .......................... | 712/32 |
| 2002/0080674 | A1 * | 6/2002 | Dobler et al. ................. | 365/222 |
| 2003/0007408 | A1 * | 1/2003 | Lien et al. ..................... | 365/222 |
| 2003/0084386 | A1 * | 5/2003 | Barth et al. .................... | 714/718 |
| 2006/0112230 | A1 * | 5/2006 | Sichert et al. ................. | 711/137 |
| 2007/0011596 | A1 * | 1/2007 | Suh ................................ | 714/800 |
| 2007/0097772 | A1 * | 5/2007 | Riho et al. ..................... | 365/222 |
| 2007/0133331 | A1 * | 6/2007 | Park et al. ..................... | 365/222 |
| 2008/0222483 | A1 * | 9/2008 | Ito et al. ........................ | 714/754 |
| 2009/0132891 | A1 * | 5/2009 | Kanno ........................... | 714/764 |

(Continued)

FOREIGN PATENT DOCUMENTS

JP          2005-293785      10/2005
KR     10201000065446 A      6/2010

*Primary Examiner* — Guerrier Merant
(74) *Attorney, Agent, or Firm* — Volentine & Whitt, PLLC

(57) ABSTRACT

A memory device comprises a normal storage area comprising first and second subsets configured to store first and second normal data, respectively, an error code storage area configured to store first and second error codes corresponding to the first and second normal data, an error detector configured to receive the first and second normal data and the first and second error codes, and further configured to detect the presence or absence of one or more errors in the first and second normal data or the first and second error codes, and a refresh controller configured to set respective refresh cycle times of the first and second subsets to different values according to the presence or absence of one or more errors in the first and second normal data or error codes.

17 Claims, 5 Drawing Sheets

(56) References Cited

U.S. PATENT DOCUMENTS

| | | | |
|---|---|---|---|
| 2010/0080076 A1* | 4/2010 | Bains et al. | 365/230.03 |
| 2010/0106901 A1 | 4/2010 | Higeta et al. | |
| 2011/0191655 A1* | 8/2011 | Schreck et al. | 714/773 |
| 2011/0231736 A1* | 9/2011 | Toops et al. | 714/768 |
| 2011/0261636 A1* | 10/2011 | Bains et al. | 365/193 |
| 2012/0221916 A1* | 8/2012 | Schreck et al. | 714/752 |
| 2012/0246544 A1* | 9/2012 | Resnick et al. | 714/764 |
| 2012/0268994 A1* | 10/2012 | Nagashima | 365/185.11 |

* cited by examiner

MEMORY DEVICE HAVING RECONFIGURABLE REFRESH TIMING

CROSS-REFERENCE TO RELATED APPLICATIONS

This application claims priority under 35 U.S.C. §119 to Korean Patent Application No. 10-2011-0110684 filed on Oct. 27, 2011, the subject matter of which is hereby incorporated by reference.

BACKGROUND OF THE INVENTION

The inventive concept relates generally to electronic memory technologies. More particularly, the inventive concept relates to a volatile memory device having reconfigurable refresh timing.

A volatile memory device loses stored data in the absence of applied power. One potential cause of this data loss is charge leakage from storage elements. For example, in a typical dynamic random access memory (DRAM), each memory cell comprises an access switch and a storage capacitor. Charges may leak from the storage capacitor due to leakage current in the access switch; as an example, a metal oxide transistor (MOS) forming the access switch may experience leakage current through a PN junction. The loss of charges on the storage capacitor may change the stored data, which can produce errors or malfunctions during system operation.

To prevent data loss, DRAM devices perform periodic refresh operations on the stored data. A refresh operation of a DRAM cell typically involves detecting stored data from the cell and applying charges to the cell according to the detected data.

Refresh operations of a DRAM device can be performed in various alternative modes, such as auto refresh mode or a self refresh mode, for example. In the self refresh mode, the DRAM device typically performs refresh operations on a group of sequentially addressed memory cells by sequentially varying an internal address in response to a refresh instruction signal.

Each memory cell is typically refreshed periodically according to a predetermined refresh cycle time (tREF). For example, if a first refresh operation occurs at a time t=0, a second refresh operation may occur at a time t=tREF, a third refresh operation may occur at a time t=2*tREF, and so on.

In general, the refresh cycle time is determined by a data retention time, which can vary between different devices or memory cells. One source of this variation includes differences in process, voltage, and temperature (PVT) conditions of the different devices or memory cells. Another source of this variation includes heat applied during packaging or set assembling or other environmental factors, which is referred to as a variable retention time (VRT). In general, the refresh characteristics tend to deteriorate during packaging or set assembling, so a refresh cycle time margin in a test stage is typically set to a small value to provide a margin for change.

Due to subtleties of the above sources of variation, it may be difficult to predict with precision the data retention time of all memory cells in a DRAM device. Consequently, it may be difficult to set the refresh cycle time of a DRAM device in a way that avoids unnecessary refresh operations without losing stored data.

In view of the foregoing, there is a general need for improved techniques to address deterioration of refresh characteristics in volatile memory devices such as DRAMs. In particular, there is a need to address deterioration that may occur through various stages of device fabrication, such as a post package repair and a post set assembly repair.

SUMMARY OF THE INVENTION

In one embodiment, a memory device comprises a normal storage area comprising first and second subsets configured to store first and second normal data, respectively, an error code storage area configured to store first and second error codes corresponding to the first and second normal data, an error detector configured to receive the first and second normal data and the first and second error codes, and further configured to detect the presence or absence of one or more errors in the first and second normal data or the first and second error codes, and a refresh controller configured to set respective refresh cycle times of the first and second subsets to different values according to the presence or absence of one or more errors in the first and second normal data or error codes.

In another embodiment, a memory device comprises a normal storage area comprising a subset and a redundancy subset, wherein the subset is configured to store normal data, an error code storage area configured to store an error code corresponding to the normal data, an error detector configured to receive the normal data and the error code and detect the presence or absence of an error in the normal data or the error code, and a repair controller configured to repair the subset with the redundancy subset according to the presence or absence of error in the normal data or error code.

In another embodiment, a method of operating a memory device comprises storing first and second normal data in respective first and second subsets of memory cells of the memory device, storing, in an error code storage area, first and second error codes corresponding to the first and second normal data, operating an error detector to detect the presence or absence of one or more errors in the first and second normal data or the first and second error codes, and setting respective refresh cycle times of the first and second subsets to different values according to the presence or absence of one or more errors in the first and second normal data or error codes.

These and other embodiments of the inventive concept may provide devices having improved refresh characteristics. These improvements may be manifest in various forms, such as reduced error rates and lower power consumption, for example.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In the description that follows, where a feature is referred to as being "connected to," or "coupled to" another feature, it can be directly connected to or coupled to the other feature or intervening features may be present. In contrast, where a feature is referred to as being "directly connected to" or "directly coupled to" another feature, there are no intervening features present. As used herein, the term "and/or" includes any and all combinations of one or more of the associated listed items.

Although the terms first, second, etc. may be used herein to describe various features, the described features should not be limited by these terms. Rather, these terms are used merely to distinguish between different features. Thus, for example, a first feature described below could be termed a second feature and vice versa without changing the meaning of the relevant description.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. Terms such as "comprises", "comprising," "includes", "including", "have", "having", etc., when used in this specification, indicate the presence of stated features but do not preclude the presence or addition of one or more other features.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and the present disclosure and will not be interpreted in an idealized or overly formal sense unless expressly so defined herein.

Figure 1:
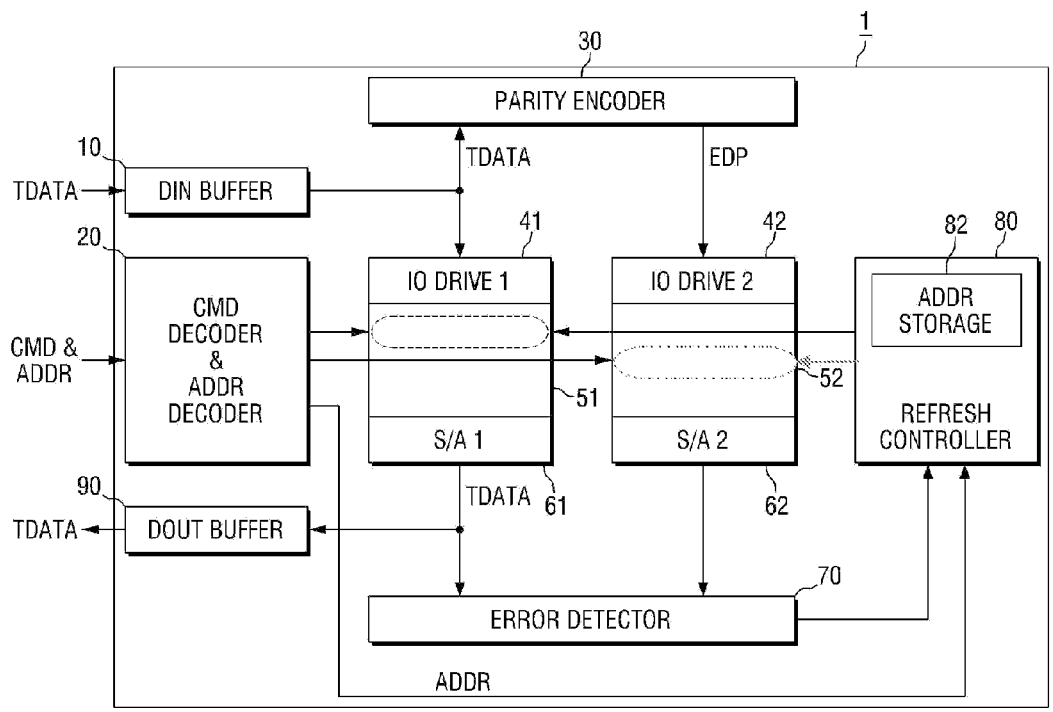
FIG. 1 is a block diagram of a memory device according to an embodiment of the inventive concept.
Figure 2:
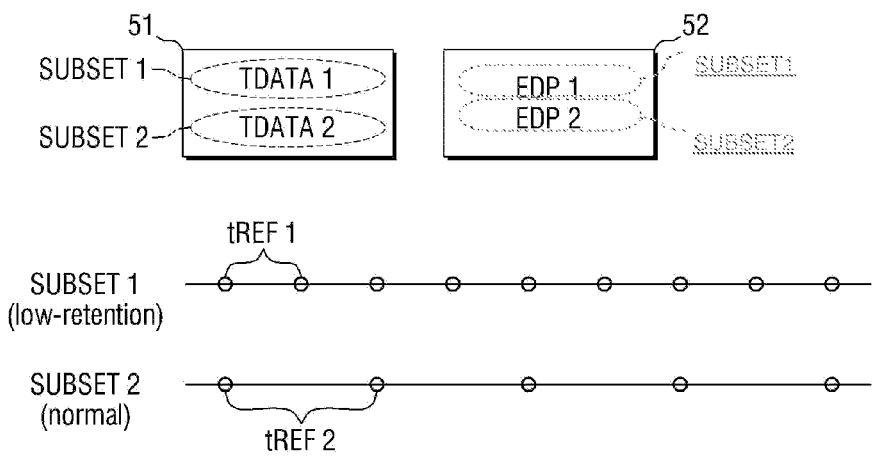
FIG. 2 illustrates a method of operating the memory device of FIG. 1 according to an embodiment of the inventive concept.

FIG. 1 is a block diagram of a memory device according to an embodiment of the inventive concept, and FIG. 2 illustrates a method of operating the memory device of FIG. 1 according to an embodiment of the inventive concept.

Referring to FIG. 1, memory device 1 comprises an input (DIN) buffer 10, a command and address (CMD & ADDR) decoder 20, a parity encoder 30, a normal storage area 51, a parity storage area 52, an error detector 70, a refresh controller 80, and an output (DOUT) buffer 90.

DIN buffer 10 receives and temporarily stores normal data TDATA, then transfers normal data TDATA to parity encoder 30 and a first drive (IO DRIVE 1) 41.

Decoder 20 decodes a command CMD to detect whether to perform a refresh operation. Decoder 20 also decodes an address ADDR to determine a subset of memory cells on which the refresh operation is to be performed. The subset is a region of normal storage area 51 that corresponds to address ADDR. The subset may comprise, for example, a single memory cell, certain rows and/or columns of memory cells, a two-dimensional array of memory cells such as a matrix, or a three-dimensional array of memory cells such as a block. Decoder 20 also transmits address ADDR to refresh controller 80.

Parity encoder 30 receives normal data TDATA and generates a parity code EDP based on the received normal data TDATA. Although a parity code (e.g., an even or odd parity code) is presented here as an example of an error detection and/or correction code (hereafter, an "error code"), other types of error codes could be used in place of parity code EDP. For example, some alternative error codes include a hamming code, a turbo code, a cyclic code, a low-density parity-check code, a Reed-Muller code, or a Reed-Solomon error correction code.

In memory device 1, parity code EDP is a detection-dedicated error code. In other words, it performs error detection but not error correction. As described in further detail below, the use of a detection-dedicated error code may reduce data overhead by comparison with an error code designed for both error detection and correction. The term "data overhead" refers to the proportion of stored data used by error codes. For instance, if one out of every eight bits of data is used as a parity bit, the data overhead is ⅛, or 12.5%.

Table 1 shows a comparison of data overhead for different numbers of test data bits and parity bits. In Table 1, a first column indicates a total number of test bits; a second column indicates a number of bits of a parity code; a third column indicates the data overhead of the parity code in the test data; a fourth column indicates a number of bits of a hamming code, and a fifth column indicates the data overhead of the hamming code in the test data.

As indicated in Table 1, the parity code produces reduced overhead compared to the hamming code. For example, to achieve single bit error correction of 8-bit test data, a hamming code may require 4-bits. In this case, the overhead is computed as 4/8*100=50.00%. To achieve single bit error detection (but not correction) of 8-bit test data, the hamming code requires 1-bit. In this case, the overhead is computed as follows: ⅛*100=12.50%.

TABLE 1

| Number of bits of test data | Number of bits of error code (only for detection) | Overhead (%) | Number of bits of error code (for detection and correction) | Overhead (%) |
|---|---|---|---|---|
| 8 | 1 | 12.50 | 4 | 50.00 |
| 16 | 1 | 6.25 | 5 | 31.25 |
| 32 | 1 | 3.12 | 6 | 18.75 |
| 64 | 1 | 1.56 | 7 | 10.93 |
| 128 | 1 | 0.78 | 8 | 6.25 |

In addition, where memory device 1 employs a masking operation, the overhead may be further reduced. The masking operation imposes a limitation on the processing of data within a specified set of locations, i.e., a masked range. For example, if a masking operation controlling signal is enabled, even if a write command is enabled, a data write operation is prevented from being performed with respect to the masked range.

During a masking operation, the number of bits of normal data TDATA that can be encoded or decoded in a group may not be greater than the number of bits on which the masking operation is performed. The reason for this restriction is as follows. Where the number of bits of normal data TDATA that can be encoded or decoded in a group is greater than the number of masked bits, and masked bits are not known to an encoder, an encoding operation cannot be performed. As an example, if a masking operation is performed in units of 8 bits (i.e., 1 byte), parity data can be generated for normal data TDATA of at most 8 bits. In an example where memory device 1 employs an 8-bit masking operation with 64-bit pre-fetching, the parity data required for detection is an 8-bit code. Here, the overhead is 8/64*100=12.50%. On the other hand, error codes for detection and correction codes require 32 bits in total, i.e., 4 bits for each 8 bits. Here, the overhead is 32/64*100=50%.

If memory device 1 does not employ a masking operation, the number of bits of normal data TDATA may be equal to the number of bits of a pre-fetch operation. For example, where memory device 1 performs 64-bit pre-fetching, the parity code is 1 bit, and the overhead is 1/64*100=1.56%. Where memory device 1 performs 128-bit pre-fetching, the parity is 1 bit, and the overhead is 1/128*100=0.78%.

First drive 41 writes normal data TDATA to a portion of normal storage area 51 corresponding to address ADDR, and a second drive (IO DRIVE 2) 42 writes the parity code EDP to a portion of parity storage area 52 corresponding to address ADDR.

Here, each of normal storage area 51 and parity storage area 52 may be two-dimensional (for example, in a matrix type) or three-dimensional (for example, in a block type) array. Each of normal storage area 51 and parity storage area 52 typically comprises a plurality of DRAM cells requiring a refresh operation.

A first sense amplifier (S/A1) 61 reads normal data TDATA from normal storage area 51, and a second sense amplifier (S/A2) 62 reads the stored parity code EDP from parity storage area 52.

Error detector 70 analyzes the read normal data TDATA and parity code EDP to determine whether there is an error in normal data TDATA or parity code EDP.

Refresh controller 80 controls setting of a refresh operation according to whether there is an error in normal data TDATA or parity code EDP. For example, if an error is detected, refresh controller 80 may reduce the refresh cycle time of the subset corresponding to the stored address ADDR. Where normal data TDATA or parity code EDP is erroneous, address ADDR of a subset of memory cells storing normal data TDATA or parity code EDP having an error and a refresh cycle time corresponding thereto are stored in an address storage component 82. Address storage component 82 typically comprises an electric fuse or a nonvolatile memory to store the address and a refresh cycle time corresponding thereto even if the power is off, but is not limited thereto.

FIG. 2 illustrates a method of operating memory device 1 according to an embodiment of the inventive concept.

Referring to FIG. 2, normal storage area 51 comprises memory cells defining a first subset SUBSET1 and a second subset SUBSET2. First normal data TDATA1 is stored in first subset SUBSET1 and second normal data TDATA2 is stored in second subset SUBSET2. Parity storage area 52 stores a parity code EDP1 corresponding to first normal data TDATA1 and a parity code EDP2 corresponding to second normal data TDATA2.

For explanation purposes, it is assumed that first normal data TDATA1 contains one or more errors, indicating that the memory cells of first subset SUBSET1 are in a low retention state. It is further assumed that the memory cells of second normal data TDATA2 do not include any errors, indicating that the memory cells of second subset SUBSET2 are in a normal retention state. Refresh controller 80 reduces a refresh cycle time tREF1 of first subset SUBSET1 due to the low retention state. Accordingly, refresh cycle time tREF1 is made shorter than a refresh cycle time tREF2 of second subset SUBSET2.

The reduction of refresh cycle time tREF1, as illustrated in FIG. 2, may provide various potential benefits when compared to conventional approaches to addressing poor charge retention. As one example, using the approach of FIG. 2, memory device 1 may perform test/repair operations using its intrinsic functions, including read and write operations. This can potentially eliminate a need to provide additional testing equipment. Because memory device 1 can perform test/repair operations using its intrinsic read and write functions, the test/repair operations can also be applied to a post package repair and post set assembly repair as well as chip production. In addition, an end user may potentially perform test/repair operations. These and other potential benefits can make it easier to prevent a memory cell from deteriorating in its refresh characteristics due to unpredictable VRT.

In addition, as described above, because memory device 1 employs a parity code EDP only for detection, its overhead may be relatively small compared to devices that using an error code to perform both detection and correction.

Figure 3:
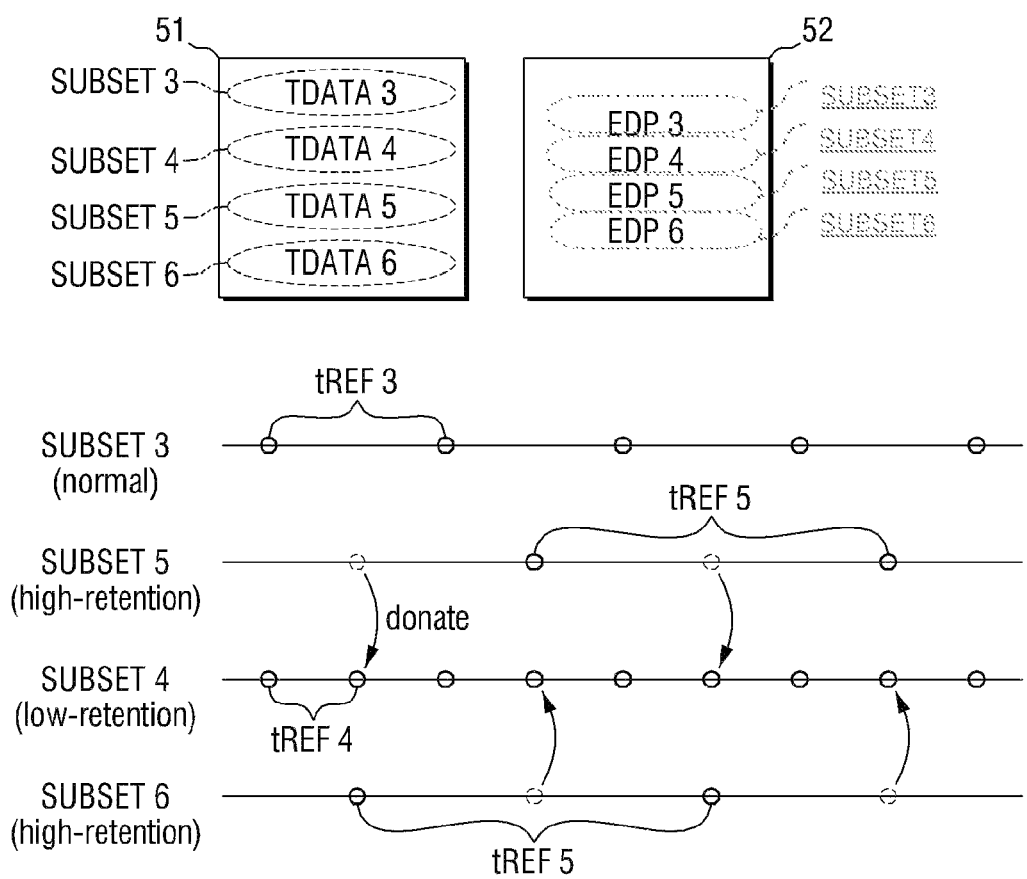
FIG. 3 illustrates a method of operating the memory device of FIG. 1 according to another embodiment of the inventive concept.

FIG. 3 illustrates a method of operating the memory device of FIG. 1 according to another embodiment of the inventive concept. To avoid redundancy, the following description will focus on differences from the description shown in FIGS. 1 and 2.

Referring to FIG. 3, normal storage area 51 comprises memory cells defining a third subset SUBSET3 through a sixth subset SUBSET6. Third normal data TDATA3 through sixth normal data TDATA6 are stored in third subset SUBSET3 through sixth subset SUBSET6, respectively.

Parity codes EDP3 to EDP6 corresponding to third normal data TDATA3 through sixth normal data TDATA6 are stored in a parity storage area 52. It is assumed that the memory cells corresponding to third normal data TDATA3 and the related parity data are in normal retention states, the memory cells corresponding to fourth normal data TDATA4 and the related parity data are in low-retention states, and the memory cells corresponding to fifth and sixth normal data TDATA5 and TDATA6 and the related parity data are in high-retention states. In this case, an address and a refresh cycle time of fourth subset SUBSET4 corresponding to the fourth normal data TDATA4 and its parity are stored in the address storage component 82.

Here, a refresh window of other subsets SUBSET5 and SUBSET6 in high-retention states is fetched by refresh controller 80 to perform a refresh operation of fourth subset SUBSET4. The term "refresh window" here refers to a time in which subsets SUBSET5 and SUBSET6 are designated to be refreshed. Refresh windows of those subsets are "donated" to fourth subset SUBSET4, as indicated by arrows in FIG. 3. Accordingly, subset SUBSET4 is refreshed within refresh windows of the those subsets.

In such a manner, a refresh cycle time tREF4 of the fourth subset SUBSET4 is made to be shorter than a refresh cycle time tREF3 of the third subset SUBSET3, and a refresh cycle time tREF3 of the third subset SUBSET3 is made to be shorter than refresh cycle times tREF5 and tREF6 of the fifth and sixth subsets SUBSET5 and SUBSET6. For example, the refresh cycle time tREF4 of fourth subset SUBSET4 may be half (½) the refresh cycle time tREF3 of third subset SUBSET3, and the refresh cycle time tREF3 of third subset SUBSET3 may be half (½) the refresh cycle times tREF5 and tREF6 of fifth and sixth subsets SUBSET5 and SUBSET6, but it is not limited thereto.

Figure 4:
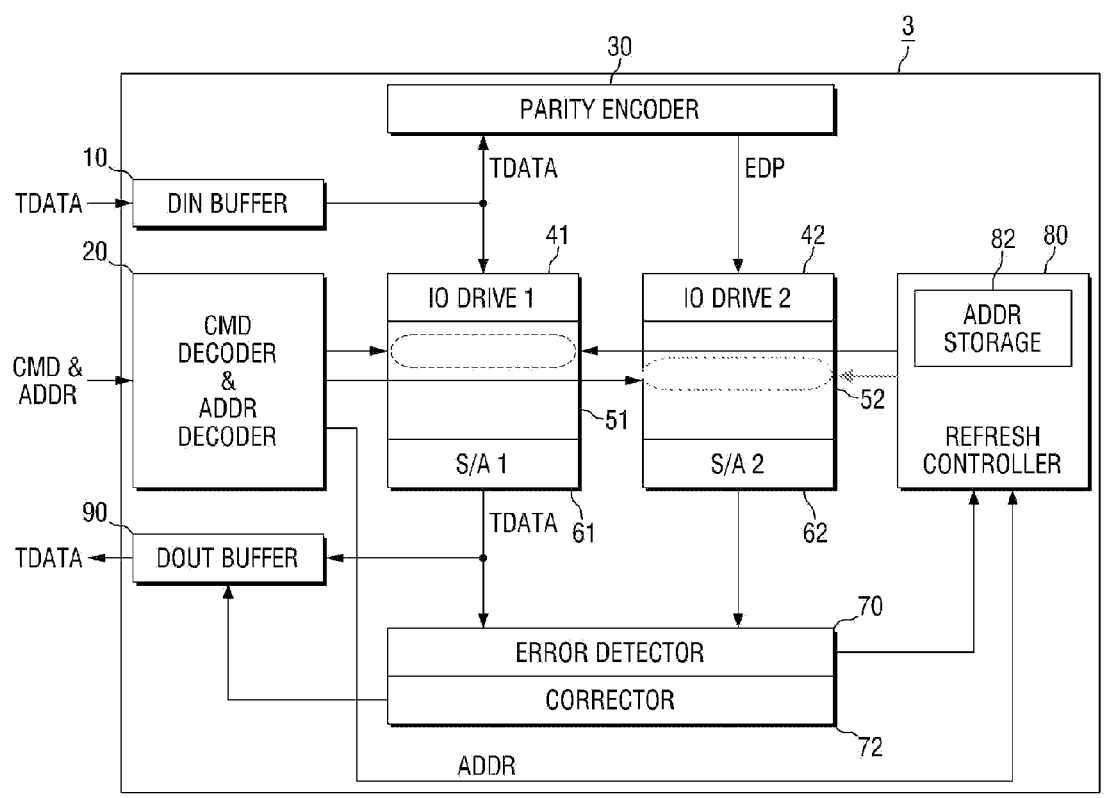
FIG. 4 is a block diagram of a memory device according to another embodiment of the inventive concept.

FIG. 4 is a block diagram of a memory device 3 according to an embodiment of the inventive concept. To avoid redundancy, the following description will focus on differences from the description shown in FIGS. 1 and 2.

Referring to FIG. 4, in memory device 3, a parity code EDP may be selectively used for error detection only or for error detection and correction.

Where memory device 3 employs a masking operation, a detection-dedicated 1-bit parity code EDP may be generated for each 8-bit normal data TDATA (see Table 1). Therefore, when the masking operation is employed, 8 (=1×8)-bit parity code EDP only for detection is required for each 64 (=8×8)- bit normal data TDATA. Here, the overhead is 12.50%. On the other hand, where the masking operation is not employed, 7-bit parity code EDP for detection and correction is required for each 64-bit normal data TDATA. Here, the overhead is 10.93% (see Table 1). As indicated by a comparison of the overheads 12.50% and 10.93%, where the masking operation is not employed, the parity code EDP used for correction has a relatively small overhead.

Alternatively, where the masking operation is employed, the 16 (=1×16)-bit parity code EDP only for detection is required for each 128 (=8×16)-bit normal data TDATA. Here, the overhead is 12.50%. However, where the masking operation is not employed, 8-bit parity code EDP for detection and correction is required for each 128-bit normal data TDATA. Here, the overhead is 6.25% (see Table 1). As indicated by a comparison of the overheads 12.50% and 6.23%, where the masking operation is not employed, the parity code EDP used for correction may have a relatively small overhead.

In memory device 3, where the parity code EDP used for correction does not have a large overhead, parity code EDP used for detection and correction is selectively used. In this case, an error corrector 72 receives the read normal data TDATA and parity code EDP used for detection and correction and corrects normal data TDATA to then output corrected data. Output (DOUT) buffer 90 outputs the corrected normal data TDATA.

In general, where memory device 3 employs a masking operation, each subset of memory cells may comprise "n" bit data (n is a natural number.), and each parity code EDP may be k bit data (k is a natural number.). In this case, each parity code EDP is a detection-dedicated code. On the other hand, where memory device 3 does not employ a masking operation, each subset may be (n×q)-bit (q is a natural number of 2 or greater) and each parity code EDP may be greater than k bits and equal to or smaller than (k×q) bits. In this case, each parity code EDP is a code used for detection and correction. Here, the (n×q) bits may be the number of bits of a pre-fetch.

Figure 5:
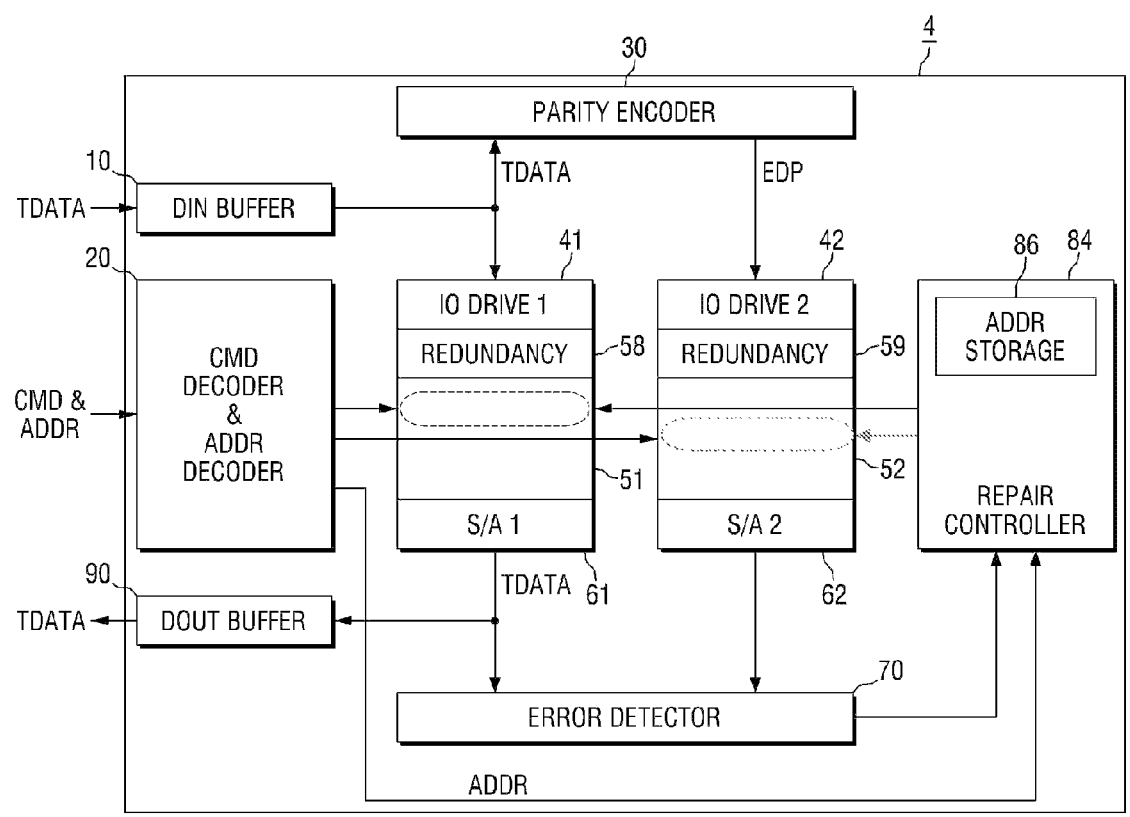
FIG. 5 is a block diagram of a memory device according to another embodiment of the inventive concept.

FIG. 5 is a block diagram of a memory device 4 according to an embodiment of the inventive concept. To avoid redundancy, the following description will focus on differences from the description shown in FIGS. 1 and 2.

Referring to FIG. 5, memory device 4 comprises a repair controller 84 and is configured to repair a subset with a redundancy subset according to whether there is an error in normal data TDATA or parity. Normal storage area 51 comprises a redundancy area 58 comprising a redundancy subset. A parity code EDP corresponding to normal data TDATA is stored in parity storage area 52.

Error detector 70 receives normal data TDATA and parity code EDP and detects whether there is an error in the normal data TDATA. Repair controller 84 repairs a subset with a redundancy subset according to whether there is an error in normal data TDATA or parity code EDP. In addition, repair controller 84 comprises an address storage component 82. Where normal data TDATA or parity code EDP is erroneous, address storage component 82 stores an address ADDR and a refresh cycle time of a subset in which normal data TDATA and parity are stored.

Parity code EDP is a detection-dedicated code, so where memory device 4 employs a masking operation, the number of bits of each normal data TDATA may be equal to the number of bits as the unit of the masking operation. On the other hand, where memory device 4 does not employ a masking operation, the number of bits of each normal data TDATA may be equal to the number of bits of a pre-fetch operation.

Figure 6:
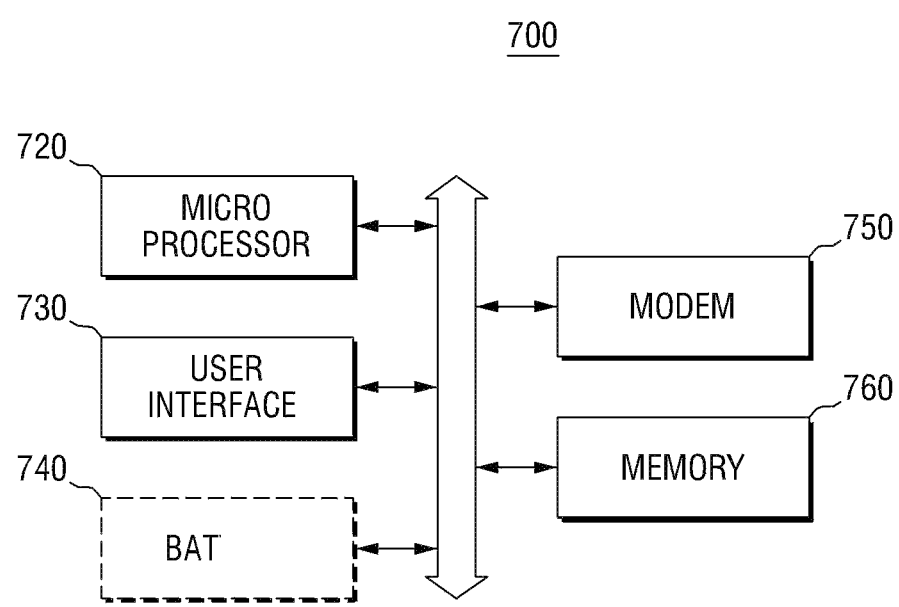
FIG. 6 is a block diagram of a system comprising a memory device according to an embodiment of the inventive concept.

FIG. 6 illustrates a system 700 comprising a memory device according to an embodiment of the inventive concept.

For example, system 700 may comprise one of memory devices 1, 3 or 4 as described above. System 700 may take various alternative forms, such as a computing system or a mobile device, for example.

Referring to FIG. 6, system 700 comprises a microprocessor 720 electrically connected to a bus 710, a user interface 730, a modem 750 such as a baseband chipset and a memory 760. Memory 760 stores data processed or to be processed by microprocessor 720. Where system 700 is a mobile device, a battery 740 may be provided to supply an operating voltage. Although not shown in FIG. 7, system 700 may further comprise additional features such as an application chip set, a camera image processor (CIS), or a NAND flash memory, for example.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A memory device, comprising:
a normal storage area comprising first and second subsets configured to store first and second normal data, respectively;
an error code storage area configured to store first and second error codes corresponding to the first and second normal data;
an error detector configured to receive the first and second normal data and the first and second error codes, and further configured to detect the presence or absence of one or more errors in the first and second normal data or the first and second error codes; and
a refresh controller configured to set respective refresh cycle times of the first and second subsets to different values according to the presence or absence of one or more errors in the first and second normal data or error codes;
wherein where the first normal data or first error code contains at least one error and the second normal data and second error code do not include any errors, the refresh controller controls the refresh cycle time of the first subset to be smaller than the refresh cycle time of the second subset.

2. The memory device of claim 1, wherein the error codes are parity codes.

3. The memory device of claim 1, wherein the error codes are detection-dedicated codes.

4. The memory device of claim 1, wherein the refresh controller comprises an address storage component, and where the first normal data or first error code comprises at least one error, the address storage component stores an address and a refresh cycle time of the first subset.

5. The memory device of claim 4, wherein the address storage component comprises an electric fuse or a nonvolatile memory.

6. The memory of claim 4, wherein where the first normal data or first error code contains at least one error, and memory cells storing the second normal data or second error code are in a high-retention state, a refresh window of the second subset is donated to the first subset.

7. The memory device of claim 1, wherein the memory device employs a masking operation and the number of bits of the first normal data and the second normal data is equal to the number of bits in units of the masking operation.

8. The memory device of claim 1, wherein where the memory device employs a masking operation, where each of the first and second subsets has n bits, where n is a natural number, and each of the first and second error codes has k bits, where k is a natural number, and where the memory device does not employ a masking operation, each of the first and second subsets has (n×q) bits, where q is a natural number, and each of the first and second error codes has more than k bits and equal to or less than (k×q) bits.

9. The memory device of claim 8, wherein where the memory device employs a masking operation, the respective first and second error codes are detection-dedicated codes.

10. The memory device of claim 8, wherein where the memory does not employ masking operation, the first and second error codes are codes used for error detection and correction.

11. The memory device of claim 8, wherein the memory device is a dynamic random access memory (DRAM) that performs a pre-fetch operation of n×q bits.

12. The memory device of claim 1, wherein the memory device is a dynamic random access memory (DRAM) that performs a pre-fetch operation, wherein the memory device does not employ a masking operation, and wherein the number of bits of each of the first and second normal data is equal to the number of bits of a pre-fetch operation.

13. The memory device of claim 1, wherein the refresh controller is configured to adjust a refresh cycle time of the first or second subset after the memory device is packaged or set assembled.

14. A method of operating a memory device, comprising:
storing first and second normal data in respective first and second subsets of memory cells of the memory device;
storing, in an error code storage area, first and second error codes corresponding to the first and second normal data;
operating an error detector to detect the presence or absence of one or more errors in the first and second normal data or the first and second error codes;
setting respective refresh cycle times of the first and second subsets to different values according to the presence or absence of one or more errors in the first and second normal data or error codes; and
where the first normal data or first error code comprises at least one error, storing an address and a refresh cycle time of the first subset in an address storage component.

15. The method of claim 14, wherein setting the respective refresh cycle times of the first and second subsets comprises reducing a refresh cycle time of the first subset relative to the refresh cycle time of the second subset upon determining that memory cells of the first subset are in a low retention state.

16. The method of claim 14, wherein setting the respective refresh cycle times of the first and second subsets comprises donating a refresh window of the second subset to the first subset upon determining that memory cells of the first subset are in a low retention state and memory cells of the second subset are in a high retention state.

17. The method of claim 14, wherein the error codes comprise parity codes, hamming codes, turbo codes, cyclic codes, low-density parity-check codes, Reed-Muller codes, or Reed-Solomon codes.

* * * * *